US006596368B1

(12) United States Patent
Liebig et al.

(10) Patent No.: US 6,596,368 B1
(45) Date of Patent: Jul. 22, 2003

(54) ORGANIC SUBSTRATE HAVING OPTICAL LAYERS DEPOSITED BY MAGNETRON SPUTTERING AND METHOD FOR PREPARING IT

(75) Inventors: Jörn-Steffen Liebig, Dresden (DE); Klaus Goedicke, Dresden (DE); Volker Kirchhoff, Dresden (DE); Gerhard Keller, Saint Maur des Fosse (FR); Richard Bosmans, Noiseau (FR); Pascal Comble, Le Perreux (FR)

(73) Assignee: Essilor International, Charenton (FR)

( * ) Notice: Subject to any disclaimer, the term of this patent is extended or adjusted under 35 U.S.C. 154(b) by 0 days.

(21) Appl. No.: 09/647,053

(22) PCT Filed: Mar. 18, 1999

(86) PCT No.: PCT/EP99/01817

§ 371 (c)(1),
(2), (4) Date: Jan. 30, 2001

(87) PCT Pub. No.: WO99/49097

PCT Pub. Date: Sep. 30, 1999

(30) Foreign Application Priority Data

Mar. 26, 1998 (EP) .............................. 98400721

(51) Int. Cl.$^7$ ................................ B32B 3/02
(52) U.S. Cl. ............... 428/64.4; 428/64.7; 428/412; 428/900; 428/694 XS; 427/128; 427/129; 427/130; 359/580; 359/582; 359/586; 359/588; 204/192.15; 204/192.26
(58) Field of Search .............. 428/412, 694 XS, 428/64.4, 64.7, 300; 427/128–130; 359/580, 582, 586, 588; 204/192.15, 192.26

(56) References Cited

U.S. PATENT DOCUMENTS

| 4,849,081 A | 7/1989 | Ross ................ 204/192.15 |
| 5,170,291 A | * 12/1992 | Szczyrbowski .......... 359/580 |
| 5,181,141 A | 1/1993 | Sato et al. ............. 353/580 |
| 5,372,874 A | * 12/1994 | Dickey ................. 428/216 |
| 5,670,030 A | 9/1997 | Solberg et al. ........ 204/192.26 |

FOREIGN PATENT DOCUMENTS

| CA | 2157070 | 8/1995 |
| DE | 4204763 | 2/1992 |
| EP | 0428358 | 5/1991 |
| EP | 0698798 A2 | 2/1996 |
| EP | 0698798 A3 | 5/1996 |
| EP | 0790326 | 8/1997 |
| FR | 2702486 | 9/1994 |
| WO | 9213114 | 5/1994 |
| WO | 9500677 | 1/1995 |

OTHER PUBLICATIONS

Abstracts of Japan, vol. 012, No. 117 (C–487), Apr. 13, 1988 and JP–A–62–240 762; Oct. 21, 1987.
Abstracts of Japan, vol. 096, No. 008, Aug. 30, 1996 and JP–A–8–94–802, Apr. 12, 1996.
Tomaszewski et al; "Yttria–stabilized zirconia thin films grown by reactive r.f. magnetron sputtering"; Thin Solid Films, vol. 287, No. 1, Oct. 30, 1996, pp. 104–109 (XP004049478).
Cueff et al. "Study of thin alumina coatings sputtered on polyethylene terephthalate films" Thin Solid Films, vol. 266, No. 2, Oct. 1, 1995, pp. 1998–204 (XP004000487).

* cited by examiner

*Primary Examiner*—Leszek Kiliman
(74) *Attorney, Agent, or Firm*—Baker Botts L.L.P.

(57) ABSTRACT

An organic substrate having optically-active layers deposited by magnetron sputtering and a preparation process for it are provided. Gas pressure used for carrying out better adhesion by sputtering is high, comprised between 0.8 and 5.0 Pa. Sputtering is particularly suitable for targets of Si, Ti, Zr and organic substrates with or without anti-abrasive coating. Improved adhesion of thin films is obtained.

64 Claims, No Drawings

ORGANIC SUBSTRATE HAVING OPTICAL LAYERS DEPOSITED BY MAGNETRON SPUTTERING AND METHOD FOR PREPARING IT

CROSS-REFERENCE TO RELATED APPLICATIONS

This application claims priority from International Application No. PCT/EP 99/01817 filed on Mar. 18, 1999, which was published in English as WO 99/49097 on Sep. 30, 1999, and which in turn claims priority from FP 98400721.1 filed on Mar. 26, 1998.

BACKGROUND OF THE INVENTION

The present invention relates to an organic substrate having optical layers deposited by magnetron sputtering, and to a method for preparing it.

In the ophthalmic field, substrates in transparent organic materials obtained, for example, by polymerizing acrylic, allylic, methacrylic or vinylic monomers are in everyday use. Deposition of thin films on lenses, such as ophthalmic lenses, in such organic materials, or in inorganic materials is also in common use. This for example makes it possible to provide anti-reflective treatment, by successive deposition of different thin films. It is necessary, in such applications, to accurately control the nature and thickness of the various layers deposited.

Conventionally, deposition of thin anti-reflective layers on ophthalmic lenses is done by vacuum evaporation. An organic substrate to be coated with or without an anti-abrasive layer, is placed in a vacuum chamber and the material to be deposited is thermally evaporated by heating or by electron bombardment. In order to improve adhesion of the thin films obtained, the substrates to be coated are heated. In the case of an organic material, the substrate must not be heated beyond 100° C.

Such a technique suffers from disadvantages. It is difficult to automate and does not allow continuous flow coating of substrates. Furthermore, stability and reproducibility of the method are not strictly guaranteed.

The layers of the anti-reflective stack can also be deposited by radiofrequency oxide sputtering, but the low rate of deposition renders this technique barely suitable for industrial use. Moreover, this type of method is poorly adapted to the use of targets of large dimensions, thereby limiting the size of the coated substrates.

As against this, cathodic sputtering, which is readily automated, makes it possible to coat substrates of varying dimensions, using continuous or semi-continues flow, while simultaneously ensuring the process is stable. It has thus been proposed to deposit thin films using magnetron sputtering at direct current (DC). This technique consists in vaporizing a solid target which has been brought to a negative potential by the action of a plasma, typically of an inert gas such as argon. Particles detached from the target are deposited on the surface to be coated at a rate, and density, which are far superior to those obtainable with low temperature vacuum deposition. The presence of a magnetic field close to the target, having lines of force parallel to the surface of the target, improves deposition rate by increasing the number of atoms that are vaporized; magnets are used for creating such a field close to the target. The operation is performed in an enclosure under high vacuum, and is called magnetron sputtering.

The technique of magnetron sputtering is well suited to the deposition of metals. In optical applications, it is necessary to deposit layers such as $ZrO_2$, $SiO_2$, $TiO_2$, $Nb_2O_5$, $Al_2O_3$, $Ta_2O_5$, $HfO_2$, $Pr_2O_3$, $Sb_2O_5$, $Y_2O_3$, $WO_3$, $In_2O_3$, $SnO_2$, $Cr_2O_3$ and mixtures thereof. However, these materials, which are non conducting, are poorly adapted to direct current magnetron sputtering. It has thus been suggested to use a metal target and a plasma consisting not only of argon, but also of oxygen, so that the metal atoms detached from the target become oxidized. This reactive sputtering technique is difficult to implement, notably in view of the difficulty of accurately maintaining constant the amount of oxygen in the plasma. Correct operating equilibrium is unstable and contamination of the target causes deposition rate to diminish.

In order to improve stability of the system, it is also been proposed to apply an alternating voltage to the cathode, rather than a DC voltage, of a sinewave or square wave type. On the positive half-cycle, the cathode is discharged. This technique is known as pulsed magnetron sputtering (PMS) and is disclosed in patent DE-A-37 00 633.

In order to still further improve operation of such a system, patent DD-A-252 205 or DE-A-38 02 852 discloses the use of two cathodes. An AC voltage is applied to each cathode, one cathode discharging while the other is being charged up under the effect of the voltage applied for vaporizing the target. This technique, called Double Magnetron Sputtering (DMS) or Twin Mag, makes it possible to avoid electric arcs.

In order to avoid excessive contamination of the target by oxygen, during sputtering, and to ensure sufficient oxidation of the layer at substrate level, it has also been proposed in patent DD-A-239 810 to regulate the oxygen throughput in the enclosure, as a function of the intensity of a spectral line of the plasma. The intensity of the spectral line emitted by the excited atoms, removed from the target, is proportional to the state of oxidation of the target. This technique is known as Plasma Emitting Monitoring (PEM).

Another method for controlling oxygen flow consists in adjusting the voltage applied to the cathode with respect to a set value. This technique is described in patent DE-A-4106513 or EP-A-501016.

It has been proposed, for example in U.S. Pat. No. 4,572,842, to introduce the reactive gas only close to the surface to be coated, thereby avoiding contamination of the target to be vaporized. U.S. Pat. No. 4,572,842 discloses the use of a septum separating the process cavity into two zones; this patent discloses an example of anti-reflective deposition on a glass substrate; the high inert gas pressure, used in conjunction with a septum, makes it possible to obtain the best reduction of contamination of the metal target by oxygen. Thus, this patent makes it possible to increase deposition rate while still ensuring operation. Patent DD-A-21 48 65 discloses a method for on-line treatment using high inert gas pressure to avoid contaminating the metal target.

It has also been proposed to proceed sequentially with the deposition of a thin metal layer using sputtering followed by oxidation thereof, this technique of sputtering followed by oxidation makes it possible to deposit a metal film under an inert gas such as argon, while preserving rate of deposition. The practical difficulty in implementing this technique is that of preventing contamination of the metal target by the oxygen used for oxidising the metal layer. An apparatus for implementing such a sequential method is disclosed in U.S. Pat. No. 4,420,385: separation of the deposition and oxidation zones which are adjacent, is achieved by means of baffles. Another apparatus is disclosed in EP-A-0,428,358. This apparatus is marketed by Optical Coating Laboratory Inc. (OCLI) under the trade name Metamode™. The deposition and oxygen zones are elongate zones parallel to the axis of the drum carrying the surfaces to be coated. A further apparatus is disclosed in WO-A-92 13114 in the name of Applied Vision Ltd. This apparatus is marketed by the company under the trade name Plasmacoat ARx10™. Oxidation is achieved using a plasma source.

The invention concerns the new problem of adhesion of thin films deposited on a transparent organic material substrate, optionally having received an anti-abrasive treatment, with use of a magnetron sputtering technique. It applies to techniques in which oxidation is sequential as well as to those using sputtering in a reactive atmosphere.

EP-A-0,428,358 mentions, in example 2, "Glass Eyeglass Lenses" that the sequential deposition and oxidation method makes it possible to obtain anti-reflective films having good abrasion resistance, for surfaces to be treated in inorganic glass. It does not mention results of tests for example 4, corresponding to anti-reflective deposition on an ophthalmic lens in organic material. WO-A-92 13114 does not mention the problem of adhesion.

The invention proposes, in a surprising fashion, to increase the gas pressure during sputtering of the metallic or semi-conducting target in order to improve adhesion of thin films deposited on a transparent organic material substrate, having optionally an anti-abrasive layer. A prejudice exists against increasing inert gas pressure for sputtering.

In one of the reference works of this subject, *Deposition Technologies for Films and Coatings*, by Rointain F. Bunshah, it is explained, on page 80, that if a film is deposited by sputtering deposition, atoms removed from the target have energies much higher than thermal energies and may be implanted into the surface to an appreciable depth. The physically incorporated atoms may then act as nucleating and bonding sites for further atom deposition. This passage encourages the person skilled in the art to use high energy atoms for favouring implantation and thus adhesion.

On page 229 of the same work, it is stated that the relatively high energies of the sputtered atoms in magnetron sputtering sources operating at low pressure and in ion beam systems may act to some degree act to promote adhesion by mechanisms similar to those in plasma bombardment. Here again, this general teaching in the relevant art, which would urge skilled worker to chose atoms of high energy.

These teachings incite the skilled worker to chose, for magnetron sputtering, low pressures; indeed, it is known that the energy of vaporized atoms decreases when inert gas pressure increases. In the context, see for example, the article by W. D. Westwood, Calculation of Deposition Rates in Diode Sputtering Systems, Journal of Vacuum Science Technology, 15(1), 1978.

In the state of the art, it is suggested to carry out sputtering at gas pressures of the order of 25 to 80 mTorr, equivalent to 3.3 to 10.64 Pa. In this context, see the work by Bunshah, page 230, for the case of plane diodes and DC current. For such diodes, as there is no plasma confinement by means of the magnetic field, a high inert gas pressure is employed, of the order of 2 to 10 Pa, in order to preserve an intense plasma. This teaching does not apply to magnetron sputtering, for which current pressures are of the order of 0.1 to 0.5 Pa.

In EP-A-0,428,358 in the name of OCLI, it is suggested to operate under an argon pressure of 2.0 micron, equivalent to $2.66.10^{-1}$ Pa, for deposition of $SiO_2$ and $TiO_2$ on a glass substrate (example 1, table 1). For a substrate in inorganic glass, and films of $SiO_2$ and $Ta2O_5$, it is suggested to operate under an argon pressure of 2.5 micron equivalent to $3.33.10^{-1}$ Pa (example 2, table 2). For a substrate in organic glass and the same films the proposed argon pressure is also 2.5 micron equivalent to $3.33.10^{-1}$ Pa (example 2, table 3). The Applied Vision Ltd. apparatus marketed under the trade name Plasmacoat AR10™ suggest working under an argon pressure of $5.10^{-3}$ mbar, equivalent to $5.10^{-1}$ Pa for depositing Si, with an argon throughput of 12 sccm. For Zr deposition, it is proposed to operate at a pressure of $8.10^{-3}$ mbar, equivalent to $8.10^{-1}$ Pa, with an Ar throughput of 17 sccm.

U.S. Pat. No. 5,170,291 to Leybold discloses a sputtering performed with a magnetron in a reactive gas atmosphere composed of a mixture of Ar and $O_2$. The target materials were Ti, Al, and Si. The pressure during the sputtering was as follows:

sputtering from the Ti-target: $5\ 10^{-3}$ mbar sputtering from the Al-target: $8\ 10^{-3}$ mbar sputtering from the Si-target: $1{,}2\ 10^{-2}$ mbar Thus, the optical layer that is deposited at high pressure is in this case the low refractive index layer.

SUMMARY OF THE INVENTION

The invention proposes, contrary to this practice and teaching, to operate at much higher pressures. It turned out, completely surprisingly, that one can thus improve adhesion of thin films on an organic substrate having optionally an anti-abrasive layer. Also, according to one embodiment, the distance between the substrate and the magnetron is at least 90 mm, preferably between 90 mm and 200 mm, especially between 90 mm and 150 mm. This greater distance between magnetron and substrate allows a lower substrate temperature, which can be highly advantageous, for example when coating temperature-sensitive substrates. Moreover, the layer uniformity, especially on curved substrates, can be further enhanced. If the method of the invention is applied for an inorganic substrate, the excellent results obtained by thermal evaporation are maintained.

More precisely, the invention provides an organic substrate having an optically-active stack on at least one side thereof, characterized in that said optically-active stack comprises at least one optical layer having a high refractive index and at least one optical layer having a low refractive index, at least one of said layers being deposited by magnetron sputtering at high pressure, for example between 0.8 to 5.0 Pa, especially above 1.0 Pa.

Notably, the invention is directed towards an organic substrate having an optically-active stack on at least one side thereof, characterized in that said optically-active stack comprises at least one optical layer having a high refractive index and at least one optical layer having a low refractive index, said at least one high refractive index layer being deposited by magnetron sputtering at high pressure.

Very surprisingly, the adhesion is greatly improved when (only) the high refractive index layer(s) is(are) deposited at high pressure.

Notably, the invention is directed towards an organic substrate having an optically-active stack on at least one side thereof, characterized in that said optically-active stack comprises at least one optical layer having a high refractive index and at least one optical layer having a low refractive index, said at least one high refractive index layer and said at least one low refractive index layer being deposited by magnetron sputtering at high pressure.

Notably, the invention is directed towards an organic substrate having an optically-active stack on at least one side thereof, characterized in that said optically-active stack comprises at least one optical layer having a high refractive index and at least one optical layer having a low refractive index, at least one of said layers being deposited by magnetron sputtering at high pressure between 0.8 to 5.0 Pa, especially above 1.0 Pa, preferably between 1.5 to 3.5 Pa, said sputtering being carried out with the substrate being located at least at 90 mm from the magnetron, preferably between 90 mm and 200 mm, especially between 90 mm and 150 mm, Specific embodiments correspond to claims 3, 4 and 6 to 18. Specific high sputtering pressure is 1.5 to 3.5 Pa.

The invention applies to substrates having an anti-reflective effect as well as a mirror effect. One or the other effect is obtained by varying the thicknesses of the layers.

The high refractive index is conventionally comprised between 2.0 and 2.6, for example between 2.1 and 2.3, whereas the low refractive index is conventionally comprised between 1.35 and 1.52, for example between 1.35 and 1.46; optionally, the ratio between these two refractive indexes is comprised between 1.5 and 2, for example between 1.5 and 1.7.

The invention also provides a method for producing an organic substrate having an optically-active stack on at least one side thereof, characterized in that said optically-active stack comprises at least one optical layer having a high refractive index and at least one optical layer having a low refractive index, said method comprising the step of depositing at least one of said optical layers by magnetron sputtering at a pressure from 0.8 Pa to 5.0 Pa, for example above 1.0 Pa, preferably 1.5 to 3.5 Pa. The distance between magnetron and the substrate is at least 90 mm, preferably comprised between 90 and 200 mm, especially between 90 mm and 150 mm, this distance being defined as the distance measured between the target and the substrate surface to be coated. Specific embodiments correspond to claims 20 to 35.

In the reactive sputtering in an argon-oxygen mixture embodiment at a pulse rate of from 10 to 100 kHz, the PMS technique as described above may be used. In the pulsed voltage alternating between two neighboring magnetrons embodiment, the DMS technique as described above may be used.

When adjusting the oxygen content of said optical layers by measuring the optical characteristics of the plasma emission, and controlling the oxygen supply as a function of a corresponding signal, the PEM technique as described above may be used. When adjusting the oxygen content of said optical layers by measuring the voltage of the reactive magnetron discharge, and controlling the oxygen supply as a function of a corresponding signal, the method employing comparison with a set value may be used.

The method according to the invention is suitable for the preparation of a substrate according to the invention.

The invention also relates to the use of this method for improving adhesion on thin films deposited on an organic material substrate.

The invention relates finally to the substrate obtained by the method according to the invention especially to an ophtalmic lense.

DETAILED DESCRIPTION OF THE PREFERRED EMBODIMENTS

Further characteristics and advantages of the invention will become more clear from the description which follows of some embodiments of the invention provided solely by way of example.

EXAMPLE 1

Sequential Sputtering and Oxidation

The examples given below were carried out using a Plasmacoat AR10 machine by Applied Vision Ltd., using sequential sputtering and oxidation, of the type described in WO-A-92 13114. Reference should be made to this document for more details regarding the structure of the machine.

In this machine, for thin $SiO_2$ and $ZrO_2$ films, the following argon pressures are envisaged for sputtering of metal films:

argon pressure for depositing Si: $4.5.10^{-3}$ mbar, equivalent to 0.45 Pa, argon pressure for deposition Zr: $6.5.10^{-3}$ mbar, equivalent to 0.65 Pa.

These values correspond to an argon throughput of:

12 sc cm for Si deposition 17 sc cm for Zr deposition.

According to the invention, thin films have been deposited, using the following argon pressures:

argon pressure for depositing Si: $0.9.10^{-2}$ mbar, equivalent to 0.9 Pa, argon pressure for depositing Zr: $1.1.10^{-2}$ mbar, equivalent to 1.1 Pa.

These values correspond to argon throughputs of:

20 sc cm for Si deposition 25 sc cm for Zr deposition.

The oxygen pressure for oxidation of the thin film deposited was not modified.

This corresponds to an increase in gas pressure of 140% and 100% in the respective cases of Si and Zr. More generally, an increase of for example 50% to 200% makes it possible to achieve satisfactory results.

The distance between the magnetron and the substrate was 120 mm.

By way of a test, anti-reflective coating was carried out on an organic substrate marketed by the applicant under the Orma trademark, on which a varnish was applied. The varnish was of the type disclosed in FR-A-2,702,486 in the name of the applicant. Such a varnish comprises a matrix obtained by polymerization of an optionally hydrolized silane; generally, an epoxysilane is used such as glycidoxypropyltrimethoxysilane, optionally in combination with one or several alkyltrialkoxysilane(s) or tetralkoxysilane. Fillers are added to this matrix, these being for example metal oxides or colloidal silica as well as a catalyst.

A varnish based on acrylates or methacrylates can also be used.

Pre-cleaning of the ophthalmic lens was carried out using an argon plasma. Following this, the following films were successively deposited under the operating conditions set out for the AR10 machine (below: standard ophthalmic lenses) and then under the operating conditions described above (below: ophthalmic lenses according to the invention):

| | |
|---|---|
| first film : $ZrO_2$ | 16 nm |
| second film : $SiO_2$ | 20 nm |
| third film : $ZrO_2$ : | 108 nm |
| fourth film : $SiO_2$ : | 84 nm |

Tests carried out in the conditions under which they will be worn, practised on standard ophthalmic lenses and on ophthalmic lenses according to the invention showed that wear was more pronounced in the case of standard ophthalmic lenses. Additionally, qualitative tests were carried out on standard ophthalmic lenses and on ophthalmic lenses according to the invention, using the procedure known as the "n10 blow test". This procedure makes it possible to evaluate adhesion of a film deposited on a substrate, such as an ophthalmic lens.

The substrate to be tested was cleaned with alcohol and placed in a holder. A SELVYT™ cloth supplied by Bergeon & Cie, CH 2400 Le Locle, was placed on the glass. A graduated eraser was brought into contact with the rag. The graduated eraser was subject to a constant force. The eraser and the substrate to be tested were then moved one with respect to the other, using an alternating movement. A cycle means 10 successive to-and-fro movements.

The operator checked the state of the substrate every 3 cycles, by visually inspecting the substrate. He noted the cycle number through which a defect appeared for the first time.

The table that follows gives the results of the "n10 blow test" on the convex face of the standard ophthalmic lens and of the ophthalmic lens according to the invention. In all, nine runs were used, each comprising 10 standard ophthalmic lenses and 10 ophthalmic lenses according to the invention. For each run, two standard ophthalmic lenses and those according to the invention were tested after 24 hours; two standard ophthalmic lenses and ophthalmic lenses were tested after one month. For the test, a PVC eraser plastified with dioctyl phtalate in the following proportions was employed:

PVC: 47.3% by weight
DOP: 47.3% by weight
alumina: 2.8% by weight
Syloid 378: 1.9% by weight
Plastolein: 0.5% by weight
Uvitex OBP: 0.2% by weight.

The eraser had dimensions of 30×25×16 mm, a Shore A hardness of 65, and was obtained by extrusion, such a eraser can be obtained from Maped Mallat, BP 14, 74371 Pringy, France. The face of the 16×25 eraser was in contact with the lens.

| Run | Standard 24 h | Invention 24 h | Standard 1 month | Invention 1 month |
| --- | --- | --- | --- | --- |
| 1 | 3 | 12 | 3 | 12 |
| 2 | 3 | 12 | 3 | 12 |
| 3 | 3 | 6 | 3 | 6 |
| 4 | 3 | 20 | 3 | 15 |
| 5 | 3 | 9 | 3 | 12 |
| 6 | 3 | 9 | 3 | nd |
| 7 | 3 | 6 | 3 | 20 |
| 8 | 3 | 9 | 3 | 30 |
| 9 | 3 | 12 | 3 | 6 |
| Mean | 3.00 | 10.56 | 3.00 | 14.13 |
| Standard deviation | 0.00 | 4.25 | 0.00 | 7.86 |

(nd: not determined)

The result in the table show that the defect appears in the standard glass starting from cycle three. However, on the glass according to the invention, the defects always appear for a number of cycles greater or equal to 6. This table confirms the surprising results of the invention.

Similar results are obtained with a $SiO_2$—$TiO_2$ stack.

Results of the same order could have been obtained on using abrasion or adhesion tests according to the MIL-C-675 standard.

The invention provides better adhesion, in the case of magnetron sputtering and successive oxidation.

The invention also makes it possible to obtain greater adhesion when using magnetron sputtering in a reactive atmosphere. In this type of treatment, according to the invention, the sputtering is done under pressures of 0.8 to 5 Pa, preferably 1.5 to 3.5 Pa.

EXAMPLE 2

Reactive Magnetron Sputtering

The coatings were deposited in an inline sputtering machine equipped with double magnetrons which work at frequencies of 100 KHz as described in patents DD 252 205 and DE 3 802 852.

For example, we obtained excellent results for a $TiO_2$—$SiO_2$—4—layers stack:

$TiO_2$: 11.4 nm
$SiO_2$: 30,2 nm
$TiO_2$: 101,5 in
$SiO_2$: 80,3 nm

The pressure during $SiO_2$ deposition was 2 Pa and 3.2 Pa for $TiO_2$. The magnetron-to-substrat distance was 90 mm.

With these parameters, the following n 10 blow test results have been achieved:

Three lenses were coated per run.

| Run | Standard 24 h | Invention 24 h | Standard 1 month | Invention 1 month |
| --- | --- | --- | --- | --- |
| 1 | 3 | 50/15/12 | 3 | 25/9/25 |
| 2 | 3 | 50/20/15 | 3 | 15/25/25 |
| 3 | 3 | 25/9/25 | 3 | 12/25/12 |
| 4 | 3 | 25/20/20 | 3 | 25/25/15 |
| Mean | 3 | 23.83 | 3 | 19.83 |
| Standard Deviation | 0.00 | 13.26 | 0.00 | 6.56 |

Similar results have been obtained at a $SiO_2$ pressure of 2 Pa and a lower $TiO_2$ pressure of 2 Pa, but with higher magnetron-to-substrat distance of 150 mm. Higher magnetron-to-substrat distance leads to better thickness uniformity on curved substrat.

In either case, it is advantageous to clean the substrate prior to sputtering. For cleaning of the substrate, a cold plasma, generated by direct current, microwave or radiofrequency can be used. A typical gas pressure of $10^{-2}$ to 100 Pa ensures correct cleaning of the substrate. The plasma used in cleaning can be an argon, oxygen plasma or yet again a plasma obtained from a mixture of these two gasses.

A mirror-like stack is obtained in a similar way, with the same materials as above, with the same indexes, by varying the thickness of each layer.

EXAMPLE 3

Reactive Magnetron Sputtering

In the same machine used for example 2, runs with. $Nb_2O_5$ instead of $TiO_2$ as high index material were carried out.

For example, we obtained excellent results for a $Nb_2O_5$—$SiO_2$—4—layers stack:

$Nb_2O_5$: 11.6 nm
$SiO_2$: 31.5 nm
$Nb_2O_5$: 118 nm
$SiO_2$: 80,3 nm

The pressure during SiO$_2$ deposition was 2.3 Pa. The magnetron-to-substrate distance was 90 mm.

The pressure during Nb$_2$O$_5$ deposition was 3.0 Pa and 1.0 Pa respectively. The magnetron-to-substrate distance was 170 mm.

With these parameters the following n 10 blow test results have been achieved (with 3 lenses per run):

| Run | 1.0 Pa tested after 24 h | 3.0 Pa tested after 24 h | 1.0 Pa tested after 1 month | 3.0 Pa tested after 1 month |
|---|---|---|---|---|
| 1 | 12/3/3 | >25/>25/>25 | 6/12/6 | >25/>25/>25 |
| 2 | 25/9/25 | >25/>25/>25 | 25/25/12 | >25/>25/>25 |
| Mean | 12.8 | >25 | 14.8 | >25 |
| Standard Deviation | 10 | 0 | 10 | 0 |

While results for the stacks deposited at deposition pressures of 1.0 Pa are good, a much higher pressure improved adhesion drastically Obviously, other embodiments are possible. Equivalent results can be obtained on other machines, like the OCLI machine, for other coatings, or for other types of substrate, as well as for any combination of the conditions described above, for example the pressure and the distance between magnetron and substrate.

We claim:

1. An organic substrate having an optically-active stack on at least one side thereof wherein said optically-active stack comprises at least one optical layer having a high refractive index and at least one optical layer having a low refractive index, said at least one high refractive index layer being deposited by magnetron sputtering at a pressure of from 1.5 Pa to 5.0 Pa.

2. An organic substrate according to claim 1, wherein said at least one low refractive index layer is deposited by magnetron sputtering at a pressure of from 1.5 Pa to 5.0 Pa.

3. An organic substrate according to claim 1 wherein said magnetron sputtering is carried out at a pressure ranging from 1.5 to 3.5 Pa.

4. An organic substrate according to claim 1 wherein said sputtering is carried out with the substrate being located at least at 90 mm from the magnetron.

5. An organic substrate having an optically-active stack on at least one side thereof wherein said optically-active stack comprises at least one optical layer having a high refractive index and at least one optical layer having a low refractive index, at least one of said layers being deposited by magnetron sputtering at high pressure from 1.5 to 5.0 Pa, said sputtering being carried out with the substrate being located at least at 90 mm from the magnetron.

6. An organic substrate according to claim 1 wherein said substrate is provided with a scratch resistant hard coating prior to deposition of said optical layers.

7. An organic substrate according to claim 6 wherein said scratch resistant hard coating comprises a polysiloxane matrix including inorganic particles.

8. An organic substrate according to claim 6 wherein said scratch resistant hard coating is obtained by one selected from the group consisting of UV, thermal and electrom beam polymerization.

9. An organic substrate according to claim 1 wherein said substrate is firstly exposed to a low pressure plasma of one selected from the group consisting of argon, oxygen, nitrogen and mixtures thereof, before depositing said optical layers.

10. An organic substrate according to claim 1 wherein said optical layers comprise SiO$_2$ and TiO$_2$.

11. An organic substrate according to claim 1 wherein said optical layers comprise SiO$_2$ and ZrO$_2$.

12. An organic substrate according to claim 1 wherein said optical layers comprise SiO$_2$ and Nb$_2$O$_5$.

13. An organic substrate according to claim 1 comprising between 2 and 15 optical layers.

14. An organic substrate according to claim 1 wherein said substrate includes an antireflective optically-active stack.

15. An organic substrate according to claim 1 wherein said substrate includes a mirror-like optically-active stack.

16. An organic substrate according to claim 1 wherein said substrate is an ophthalmic lens.

17. An organic substrate according to claim 16 wherein the substrate comprises a polymer obtained by polymerization of one selected from to group consisting of acrylic, allylic, methacrylic and vinylic monomers.

18. An organic substrate according to claim 16 wherein the substrate comprises polycarbonate.

19. An organic substrate having an optically-active stack on at least one side thereof wherein said optically-active stack comprises at least one optical layer having a high refractive index and at least one optical layer having a low refractive index comprising depositing at least one of said optical layers by magnetron sputtering at a pressure from 1.5 Pa to 5.0 Pa.

20. The method according to claim 19 wherein the substrate is located at least at 90 mm from the magnetron.

21. The method according to claim 19 wherein said magnetron sputtering is non-reactive magnetron sputtering in argon, followed by an oxidation step in a plasma containing oxygen, said sputtering and oxidation steps being optionally repeated.

22. The method according to claim 19 wherein said magnetron sputtering is partial reactive magnetron sputtering in argon-oxygen mixture, followed by an oxidation step in a plasma containing oxygen, said sputtering and oxidation steps being optionally repeated.

23. The method according to claim 19 wherein said magnetron sputtering is reactive sputtering in an argon-oxygen mixture at high pressure, using a voltage pulsed at a pulse rate of from 10 to 100 kHz.

24. The method according to claim 23 wherein said magnetron sputtering employs a pulsed voltage alternating between two neighboring magnetrons of the same type having the same target material, at a pulse rate of from 10 to 100 kHz.

25. The method according to claim 19 further comprising covering the substrate with a scratch resistant hard coating before depositing said optical layers.

26. The method according to claim 19 comprising exposing the substrate to a low pressure plasma of one selected from the group consisting of argon, oxygen, nitrogen and mixtures thereof, before deposition of said optical layers.

27. The method according to claim 19 comprising adjusting oxygen content of said optical layers by measuring the optical characteristics of the plasma emission, and controlling the oxygen supply as a function of a corresponding signal.

28. The method according to claim 19 comprising adjusting oxygen content of said optical layers by measuring the voltage of reactive magnetron discharge, and controlling the oxygen supply as a function of a corresponding signal.

29. The method according to claim 19 further comprising coating the substrate with an optically-inactive interface layer before deposition of said optical layer, said optically-inactive interface layer being deposited using sputtering technique in a non-reactive or partially reactive mode.

30. The method according to claim 29 wherein said interface layer is deposited by magnetron sputtering of silicon.

31. The method according to claim 29 wherein said interface layer is deposited by magnetron sputtering of titanium.

32. The method according to claim 29 wherein said interface layer is deposited by magnetron sputtering of zirconium.

33. The method according to claim 19 wherein said optically-active stack is simultaneously deposited on both sides of said substrate.

34. The method according to claim 19 wherein said optical layers include $ZrO_2$ and are deposited at a pressure of at least 1.5 Pa.

35. An organic substrate according to claim 4 wherein sputtering is carried out with the substrate being located between 90 mm and 200 mm from the magnetron.

36. An organic substrate according to claim 5 wherein at least one of said layers is deposited by magnetron sputtering at high pressure between 1.5 to 3.5 Pa.

37. An organic substrate according to claim 5 wherein sputtering is carried out with the substrate being located between 90 mm and 200 mm from the magnetron.

38. An organic substrate according to claim 36 wherein sputtering is carried out with the substrate being located between 90 mm and 200 mm from the magnetron.

39. An organic substrate according to claim 5 wherein said optical layer comprise $SiO_2$ and $TiO_2$.

40. An organic substrate according to claim 5 wherein said optical layer comprise $SiO_2$ and $ZrO_2$.

41. An organic substrate according to claim 5 wherein said optical layers comprise $SiO_2$ and $Nb_2O_5$.

42. An organic substrate according to claim 13 wherein all the optical layers are obtained by magnetrons sputtering.

43. An organic substrate according to claim 5 wherein said substrate is an ophthalmic lens.

44. An organic substrate according to claim 43 wherein the substrate comprises a polymer obtained by polymerization of one selected from the group consisting of acrylic, allylic, methacrylic and vinylic monomers.

45. An organic substrate according to claim 43 wherein the substrate comprises polycarbonate.

46. The method according to claim 19 comprising depositing at least one of said optical layers by magnetron sputtering at a pressure from 1.5 to 3.5 Pa.

47. The method according to claim 19 wherein the substrate is located between 90 mm and 200 mm from the magnetron.

48. The method according to claim 46 wherein the substrate is located between 90 mm and 200 mm from the magnetron.

49. The method according to claim 29 wherein the optically-inactive interface layer is 2 to 10 mm thick.

50. The method according to claim 19 wherein said optical layers comprise $ZrO_2$.

51. The method according to claim 20 wherein said magnetron sputtering is non-reactive sputtering in argon, followed by oxidation in a plasma containing oxygen, said sputtering and oxidation steps being optionally repeated.

52. The method according to claim 20 wherein said magnetron sputtering is partial reactive magnetron sputtering in argon-oxygen mixture, followed by an oxidation step in a plasma containing oxygen, said sputtering and oxidation steps being optionally repeated.

53. The method according to claim 20 wherein said magnetron sputtering is reactive sputtering in an argon-oxygen mixture at high pressure, using a voltage pulsed at a pulse rate of from 10 to 100 kHz.

54. The method according to claim 53 wherein said magnetron sputtering employs a pulsed voltage alternating between two neighboring magnetrons of the same type having the same target material, at a pulse rate of from 10 to 100 kHz.

55. The method according to claim 20 further comprising covering the substrate with a scratch resistant hard coating before depositing said optical layers.

56. The method according to claim 20 comprising exposing the substrate to a low pressure plasma of one selected from the group consisting of argon, oxygen, nitrogen and mixtures thereof, before deposition of said optical layers.

57. The method according to claim 20 comprising adjusting oxygen content of said optical layers by measuring the optical characteristics of the plasma emission, and controlling the oxygen supply as a function of a corresponding signal.

58. The method according to claim 20 comprising adjusting oxygen content of said optical layers by measuring the voltage of reactive magnetron discharge, and controlling the oxygen supply as a function of a corresponding signal.

59. The method according to claim 20 further comprising coating the substrate with an optically-inactive interface layer before deposition of said optical layer, said optically-inactive interface layer being deposited using sputtering technique in a non-reactive or partially reactive mode.

60. The method according to claim 53 wherein said interface layer is deposited by magnetron sputtering of silicon.

61. The method according to claim 53 wherein said interface layer is deposited by magnetron sputtering of titanium.

62. The method according to claim 53 wherein said interface layer is deposited by magnetron sputtering of zirconium.

63. The method according to claim 53 wherein said optically-active stack is simultaneously deposited on both sides of said substrate.

64. The method according to claim 53 wherein said optical layer comprise $ZrO_2$.

* * * * *